United States Patent [19]

Dantzler

[11] 4,023,871
[45] May 17, 1977

[54] CABINET
[75] Inventor: Danny M. Dantzler, Lincoln, Nebr.
[73] Assignee: Hy-Gain Electronics Corporation, Lincoln, Nebr.
[22] Filed: Mar. 15, 1976
[21] Appl. No.: 667,123
[52] U.S. Cl. .............................. 312/107; 312/108; 312/111
[51] Int. Cl.² ...................................... A47B 87/00
[58] Field of Search ......... 312/330 SM, 7 TV, 108, 312/107, 257 A, 257 SM, 111

[56] References Cited

UNITED STATES PATENTS

| | | | |
|---|---|---|---|
| 2,752,215 | 6/1956 | Peiss | 312/111 |
| 3,159,436 | 12/1964 | Davis | 312/107 |
| 3,203,744 | 8/1965 | Batke et al. | 312/111 |
| 3,575,465 | 4/1971 | Dolby et al. | 312/107 |
| 3,606,506 | 9/1971 | Ungaro | 312/111 |
| 3,628,098 | 12/1971 | Sturdivan | 312/257 SM |
| 3,655,065 | 4/1972 | Yellin | 312/107 X |
| 3,762,600 | 10/1973 | Kreutzweiser | 312/111 |
| 3,847,460 | 11/1974 | Weidt | 312/111 |
| 3,860,309 | 1/1975 | Brendgord | 312/108 |

FOREIGN PATENTS OR APPLICATIONS 2,239,239  8/1973  Germany .................. 312/111

Primary Examiner—Paul R. Gilliam
Assistant Examiner—Victor N. Sakran
Attorney, Agent, or Firm—Vincent L. Carney

[57] ABSTRACT

To form a universal electrical cabinet that can be assembled without conventional fasteners, the side sections of a U-shaped member each have an outwardly-extending flange that abuts a corresponding outwardly-extending flange on the side sections of an inverted U-shaped member, with the central sections of the U-shaped member and inverted U-shaped members forming the bottom and top of the cabinet respectively and the side sections combining to form two sides of the cabinet. Tracks or grooves along the front and the rear of the U-shaped and inverted U-shaped members receive front and rear panel members for the cabinet, with the front member having the dials and meters and the like and the rear member generally having electrical connectors. Elongated C-shaped members fit over the flanges where they abut to hold the side sections together so as to form a cabinet. Printed circuits and the like are mounted within the cabinet by suitable abutments and ridges in the U-shaped and inverted U-shaped members.

9 Claims, 5 Drawing Figures

CABINET

This invention relates to cabinets for electrical equipment.

One class of cabinet for electrical equipment is designed to be easily assembled with slot-like or groove-like members fitting together to hold the walls of the cabinet. The slot-like members generally slide together to hold the sides of the front and the rear panels in place, with printed circuits fitting within the cabinet and carrying the bulk of the circuitry of the electrical equipment.

In a prior art type of cabinet of this class, the fastening members are relatively complicated elongated structures that fit along the corners of the cabinet to hold the panel sections together. The prior art type of cabinet has a disadvantage in that the wall members and the holding or fastening members have complicated shapes and are difficult to form. It is often difficult to assemble the cabinets together as well.

Accordingly, it is an object of the invention to provide a novel cabinet for electrical equipment.

It is a further object of the invention to provide a novel cabinet which may be assembled without conventional fastening devices.

It is a still further object of the invention to provide a cabinet for electrical equipment which may be quickly and easily assembled to reduce the time required for manufacturing of the equipment.

It is a further object of the invention to provide a cabinet in which two elongated channel-shaped members are the fasteners for a U-shaped member and an inverted U-shaped member that form the sides, top and bottom of the cabinet, with the front and rear of the cabinet being held by the U-shaped and inverted U-shaped members.

In accordance with the above and further objects of the invention a cabinet includes a U-shaped member and an inverted U-shaped member with each of the U-shaped and inverted U-shaped members having a central section and two side sections extending at an angle in the same direction from the central section and ending in outwardly-extending flanges. The edges of the inner surfaces of the U-shaped and inverter U-shaped members include parallel walls adapted to receive front and rear panels and the interior of the U-shaped and inverted U-shaped members include abutments for fastening of electrical equipment such as printed circuit cards.

The side portions of the inverted U-shaped member and the U-shaped member slant outwardly, thus forming an obtuse angle with the central section for ease of molding. Because the side sections slant outwardly, the parallel walls are larger at the top portion of the side sections so their outer edge is orthogonal to the central section, thus forming a square frame for the front and rear panels for esthetic reasons.

To assemble the cabinet, the front and rear panels are inserted along the tracks of the bottom channel member, with the central section of the U-shaped member forming the bottom of the cabinet and the two side sections forming half of the left and right sides. The printed circuit boards and other components are positioned within the cabinet at this time and are fastened in place.

After the front and rear panels and the circuit boards and other components are positioned in the U-shaped member, the inverted U-shaped member is positioned over the U-shaped member with corresponding parallel walls along the edges of the inverted U-shaped member receiving the front and rear panels of the cabinet and the outwardly-extending flanges of the side sections abutting each other. Elongated extruded members are slid along the abutting flanges to hold the U-shaped and inverted U-shaped members together, thus completing the assembly of the cabinet.

From the above description, it can be understood that the cabinet of this invention has the advantages of being: (1) formed of inexpensive and simple parts; (2) easy to assemble and disassemble; (3) of relatively low cost; and (4) suitable for packaging many different types of equipment.

The above noted and other features of the invention will be better understood from the following detailed description when considered in the light of the accompanying drawings in which.

Figure 1:
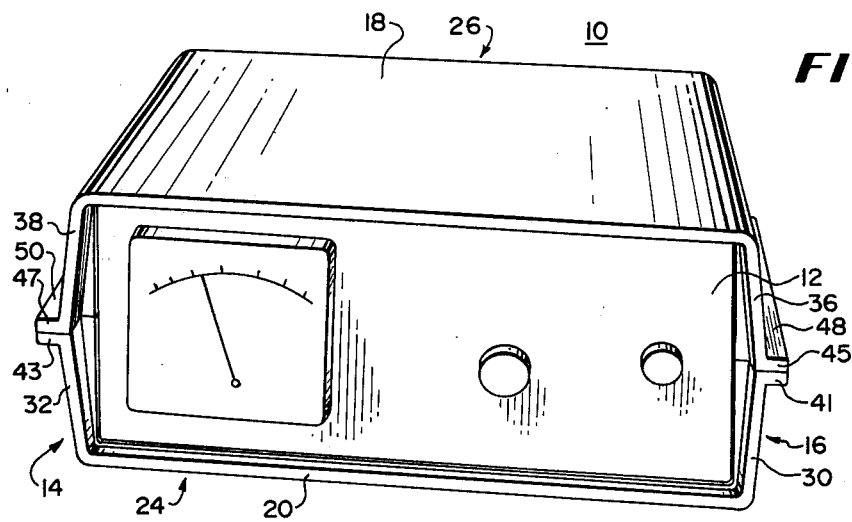
FIG. 1 is a perspective view of the front of a universal cabinet in accordance with an embodiment of the invention.
Figure 2:
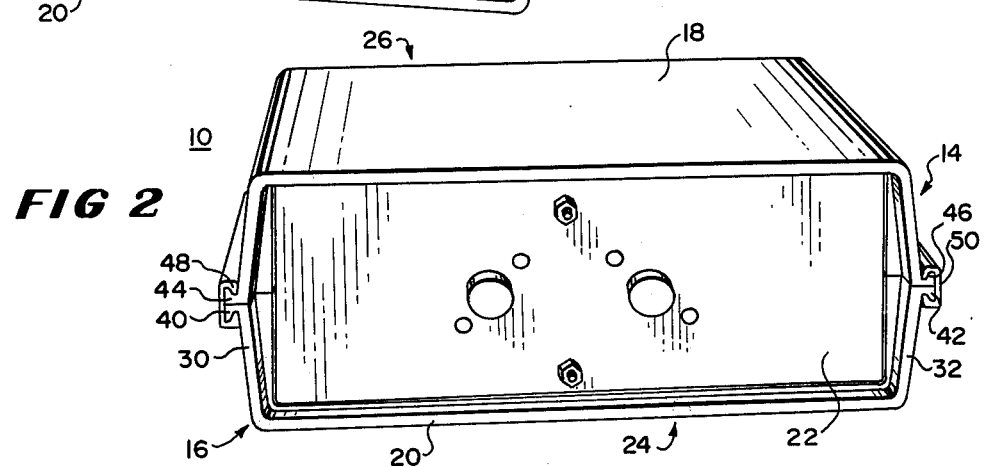
FIG. 2 is a perspective view from the rear of the cabinet showing the embodiment of FIG. 1.

In FIGS. 1 and 2, there is shown a cabinet 10 having a front panel 12, (not shown in FIG. 2) two sides 14 and 16, a top 18, a bottom 20, and a rear panel 22 (not shown in FIG. 1). The front and rear panels and the sides, top and bottom of the cabinet are formed in such a way as to be easily assembled without conventional fasteners. For this purpose, the front panel 12 and rear panel 22 are each separate panels which can be assembled into the cabinet whereas the sides, top and bottom of the cabinet are formed principally of two members.

In the preferred embodiment, the top, bottom and sides are formed of a U-shaped member 24 and an inverted U-shaped member 26, with the U-shaped member 24 forming the bottom and half of each of the right and the left sides 16 and 14 of the cabinet 10 and the inverted U-shaped member 26 forming the top and half of the right and left sides of the cabinet.

The first U-shaped member 24 has a central section 20 forming the bottom of the cabinet and first and second side sections 30 and 32, with the side sections 30 and 32 forming an angle with the central section 20 which is slightly greater than 90° to form a channel. While the angle may be 90°, a slightly larger angle enables the parts to be more easily fabricated particularly if they are to be molded from plastic. Similarly, the inverted U-shaped member 26 includes a central section 18 forming the top and first and second side sections 36 and 38, with the side sections 36 and 38 forming an angle with the central section 18 which is slightly greater than 90° to form a channel-shaped member.

To hold the U-shaped and inverted U-shaped members 24 and 26 together, each of the side sections 30, 32, 36 and 38 have a respective one of the outwardly-extending flanges 40, 42, 44 and 46 (FIG. 2) ending in stops 41, 43, 45 and 47 (FIG. 1) respectively at the front of the cabinet. Each of the outwardly-extending flanges has an outwardly-extending ear and a flat surface forming the outer edge of the channel which matches with a corresponding flat surface on the opposite flange member to form a horizontal T-shaped projection from the cabinet. Flanges 40 and 44 are fastened together to form a first T-shaped projection and flanges 42 and 46 are fastened together to form a second T-shaped projection to hold the U-shaped and inerted U-shaped members 24 and 26 together in assembling the cabinet.

To fasten the flanges together, a first extruded elongated C-shaped or channel-shaped fastener 48 is mounted around the outwardly-extending ears of the flanges 40 and 44 and a second extruded elongated C-shaped fastener 50 is mounted around the outwardly-extending ears of the flanges 42 and 46. As will be explained in greater detail hereinafter, all of the parts of the cabinet 10 and the parts of the instrument contained therein are secured after the U-shaped and inverted U-shaped members are fastened together by the C-shaped fasteners 48 and 50. The stops 41, 43, 45 and 47 improve the appearance of the cabinet and aid in aligning the C-shaped fasteners 48 and 50, which are applied from the back of the cabinet over the flanges 40, 42, 44 and 46.

Figure 3:
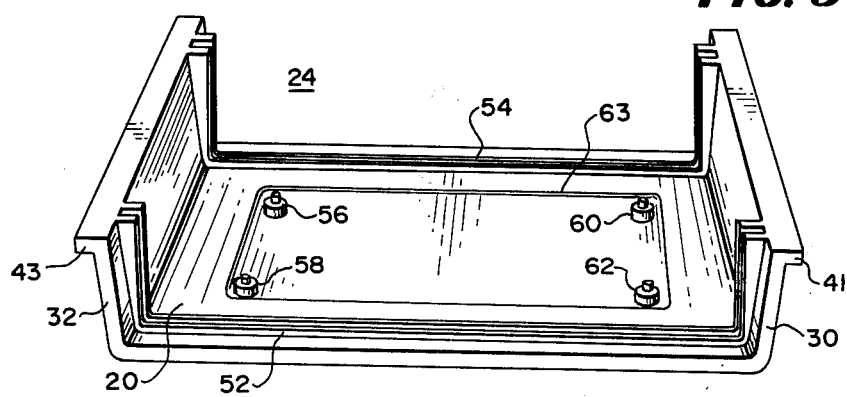
FIG. 3 is a perspective view of a U-shaped member forming a part of the embodiment of FIG. 1.

As best shown in FIG. 3, the inside surface of the U-shaped member 24 includes adjacent to its front edge, a first upwardly-extending slotted mounted ridge 52 and adjacent to its rear edge, a second upwardly-extending slotted mounting ridge 54, with each of the mounting ridges extending near its respective edge across the center and side sections 20, 30 and 32 to receive the front and back panels 12 and 22 of the cabinet 10.

The mounting ridges 52 and 54 each include a different pair of upwardly-extending parallel walls with a space between them of sufficient width to receive the edge of the front or rear panel, which walls are longer in proportion to the height along the sides 30 and 32 to compensate for the slope of these sides. Although mounting ridges are used in the preferred embodiment, it is obvious that other types of fastening techniques may be used such as a single elongated recess to receive the edge of the plates.

The inner surface of the central section 20 of the U-shaped member 24 also includes four upwardly-extending studs 56, 58, 60 and 62. These studs are molded by an insert in the die, the sprue of which results in the rectangular groove 63 shown in the inside of the central section 20 in FIG. 3. This removable insert may accommodate different arrangements of bosses of other support structures within the U-shaped member to accommodate different circuit elements.

Figure 4:
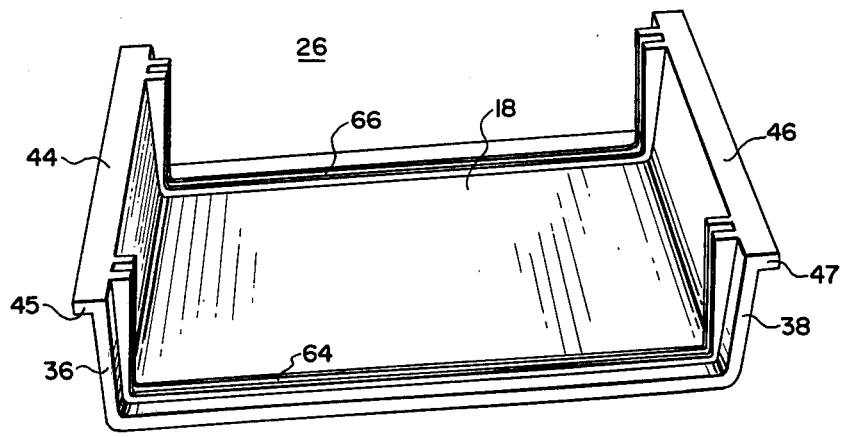
FIG. 4 is a perspective view of the inside of the top of an inverted U-shaped member forming a portion of the embodiment of FIG. 1.

In FIG. 4, there is shown a perspective view of the top or inverted U-shaped member 26 viewed from its inner side, having first and second upwardly-extending slotted ridges 64 and 66 corresponding to the slotted ridges 52 and 54 for the U-shaped member shown in FIG. 3. The ridges 64 and 66 are complimentary to the ridges 52 and 54 and engage the opposite sides of the front and rear panel so that the front and rear panel is held between the U-shaped and inverted U-shaped members 24 and 26.

The inverted U-shaped member is formed identically to the U-shaped member except that it does not include the posts 56–62 nor the flashing from the insert in the die that forms the posts. Accordingly, its bottom inside surface is entirely smooth although the dies could be made to have posts both in the first and second channel-shaped members. It is, however, customary to have the support posts only on the first shaped member which forms the bottom of the cabinet.

Figure 5:
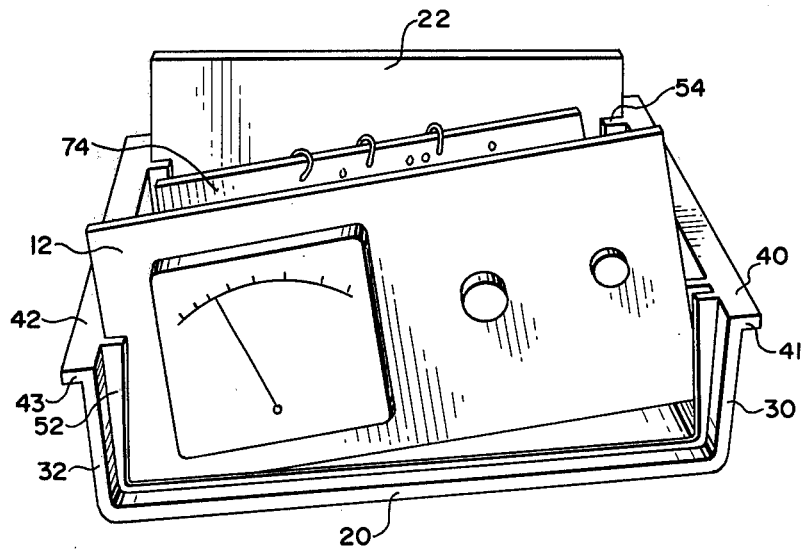
FIG. 5 is a partially-disassembled view of the embodiment of FIG. 1 illustrating the manner in which it is assembled.

To assemble the cabinet: (1) the front panel 12 and the rear panel 22 are inserted within the slots in the slotted ridges 52 and 54 respectively as shown in FIG. 5; (2) printed circuit boards such as the board shown at 74 in FIG. 5 are positioned between the front panel 12, back panel 22, and sides 30, 32, 36 and 38; and (3) other components are fastened to the posts 56–62. The electrical connections are then made to provide outlets such as the antennas and the like as necessary.

After the front and rear panels 12 and 22, printed circuit boards and other components are fastened firmly in place in the U-shaped member 24, the inverted U-shaped member 26 is then inserted, with the front and rear panels fitting within the slotted ridges 64 and 66 to form a closed cabinet which holds the front and rear panels and printed circuit boards without any conventional fasteners. To hold the first and second channel members together, the C-shaped members 48 and 50 are then slid over the flanges 40, 42, 44 and 46 from the rear of the cabinet to its front surface where they abut the stops 41, 43, 45 and 47 so that their edges are not visible from the front. The extrusions hold the two-channel members together, and the channel members support the front and rear panels and the printed circuit boards therein between.

As can be understood from the above description, the cabinet of this invention has the advantages of: (1) being made of economically-formed parts; (2) being adaptable for different types of electronic apparatus; (3) being easily assembled during manufacturing; and (4) being easy to disassemble for repair or replacement of parts.

Although a preferred embodiment has been described with some particularity, many modifications and variations in the invention are possible within the light of the above teachings. It is therefore to be understood that, within the scope of the appended claims, the invention may be practiced other than as specifically described.

What is claimed is:

1. A cabinet for electronic equipment comprising;
   a front panel and a rear panel;
   a U-shaped member having a central section and two side sections, said side sections extending at an angle to said central section;
   each of said side sections of said U-shaped member having a different outwardly-extending flange at its distal end;
   an inverted U-shaped member having a central section and two side sections extending at an angle to the central section;
   each of said side sections of said inverted U-shaped member having a different outwardly-extending flange at its distal end;
   fastener means along said U-shaped and inverted U-shaped members for receiving said front and rear panels;
   said outstanding flanges being shaped to abut each other when said U-shaped and inverted U-shaped members are positioned together around said front and rear panels;
   channel means for holding said end flanges of said first U-shaped member to said flanges of said inverted U-shaped member, whereby a cabinet is formed for holding electrical equipment within it;
said fastener means including parallel wall members forming slotted ridges;
    said parallel wall members being spaced from each other a distance substantially equal to the thickness of said panels;
    said side sections forming an obtuse angle with said center sections of said U-shaped and inverted U-shaped members;
    said slotted ridges being larger at the top of said end members than at the bottom.

2. A cabinet according to claim 1 in which said front and rear panels have relatively flat planer edges in the same plane extending there around.

3. A cabinet in accordance with claim 2 in which said channel means are extruded channel-shaped plastic members.

4. A cabinet in accordance with claim 1 in which one side of said flanges includes abutting ears of at least the same size as said channel means.

5. A cabinet in accordance with claim 4 in which said flanges include longitudinal grooves adjacent to said side sections, whereby the edges of said channel means fit within said grooves.

6. A cabinet in accordance with claim 1 in which said channel means are extruded channel-shaped plastic members.

7. A cabinet in accordance with claim 6 in which said fastener means include parallel wall members forming slotted ridges, said parallel wall members being spaced from each other a distance substantially equal to the thickness of said panels.

8. A cabinet according to claim 7 in which said side sections include inwardly-extending spaced ledges positioned from each other to receive printed circuit boards.

9. A cabinet according to claim 7 in which said central section of said U-shaped member includes upstanding bosses to which electrical components may be fastened.

* * * * *